United States Patent
Beierl et al.

(10) Patent No.: US 8,436,982 B2
(45) Date of Patent: May 7, 2013

(54) PROJECTION OBJECTIVE FOR MICROLITHOGRAPHY

(75) Inventors: Helmut Beierl, Heidenheim (DE); Heiko Feldmann, Aalen (DE); Jochen Hetzler, Aalen (DE); Michael Totzeck, Schwaebisch Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 365 days.

(21) Appl. No.: 12/723,496

(22) Filed: Mar. 12, 2010

(65) Prior Publication Data

US 2010/0201959 A1    Aug. 12, 2010

Related U.S. Application Data

(63) Continuation of application No. PCT/EP2008/062835, filed on Sep. 25, 2008.

(60) Provisional application No. 60/976,935, filed on Oct. 2, 2007.

(30) Foreign Application Priority Data

Oct. 2, 2007 (DE) .......................... 10 2007 047 148

(51) Int. Cl.
*G03B 27/54* (2006.01)
*G03B 27/52* (2006.01)
*G03B 27/42* (2006.01)

(52) U.S. Cl.
USPC ................................ 355/67; 355/30; 355/53

(58) Field of Classification Search ............ 355/30, 355/53, 67; 359/355, 618
See application file for complete search history.

(56) References Cited

U.S. PATENT DOCUMENTS

| | | | |
|---|---|---|---|
| 5,610,683 A * | 3/1997 | Takahashi | 355/53 |
| 7,710,653 B2 * | 5/2010 | Ikezawa et al. | 359/618 |
| 7,724,350 B2 * | 5/2010 | Yamashita | 355/53 |
| 2003/0021040 A1 | 1/2003 | Epple et al. | |
| 2004/0001190 A1 | 1/2004 | Tsuji | |
| 2005/0068499 A1 | 3/2005 | Dodoc et al. | |
| 2006/0176461 A1 | 8/2006 | Sekine | |
| 2006/0256447 A1 | 11/2006 | Dodoc | |

(Continued)

FOREIGN PATENT DOCUMENTS

| | | |
|---|---|---|
| EP | 1670042 | 6/2006 |
| EP | 1760528 | 3/2007 |

(Continued)

OTHER PUBLICATIONS

Japanese Office Action, with English translation, issued in JP 2010-527410 on Oct. 12, 2012.

*Primary Examiner* — Hung Henry Nguyen
(74) *Attorney, Agent, or Firm* — Fish & Richardson P.C.

(57) ABSTRACT

A projection objective for microlithography includes at least one optical assembly with optical elements which are disposed between an object plane and an image plane. The optical assembly includes at least one optical terminal element, which is disposed close to the image plane. A first immersion liquid is disposed on the image oriented surface of the optical terminal element. A second immersion liquid is disposed on the object oriented surface of the optical terminal element. The object oriented surface includes a first surface section for the imaging light to enter into the terminal element, and the image oriented surface includes a second surface portion for the imaging light to exit from the terminal element.

23 Claims, 6 Drawing Sheets

U.S. PATENT DOCUMENTS

2007/0188879 A1  8/2007  Ikezawa et al.
2008/0100909 A1* 5/2008  Tsuda .......................... 359/355

FOREIGN PATENT DOCUMENTS

| | | |
|---|---|---|
| EP | 1768169 | 3/2007 |
| EP | 1768171 | 3/2007 |
| EP | 1843385 | 10/2007 |
| JP | 2004-246343 | 9/2004 |
| JP | 2005-086148 | 3/2005 |
| JP | 2005/268741 | 9/2005 |
| JP | 2006/222222 | 8/2006 |
| WO | 2006/080212 | 8/2006 |
| WO | 2006/089919 | 8/2006 |
| WO | WO 2006/128613 | 12/2006 |

* cited by examiner

PRIOR ART

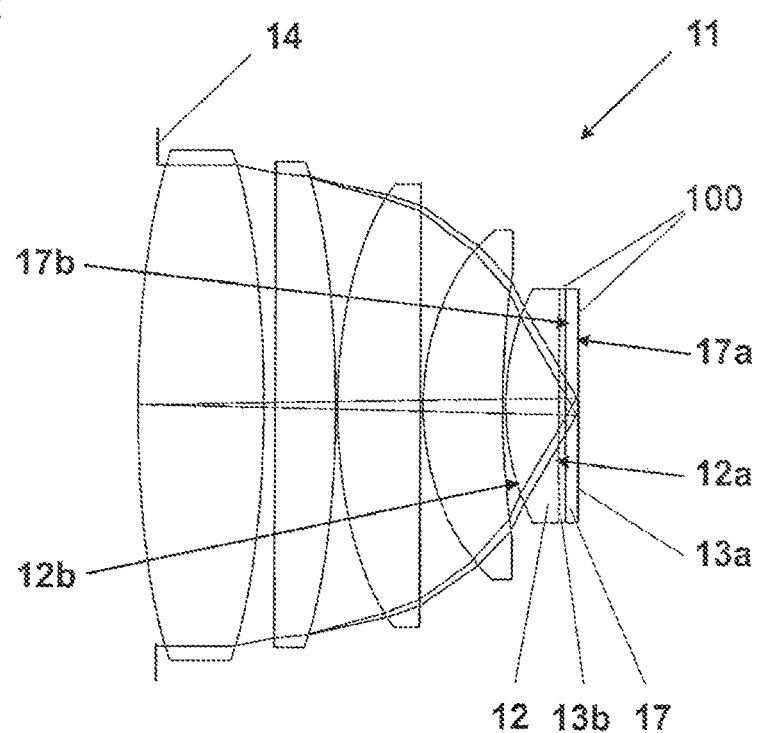

PROJECTION OBJECTIVE FOR MICROLITHOGRAPHY

CROSS-REFERENCE TO RELATED APPLICATIONS

This application is a continuation of, and claims benefit under 35 USC 120 to, international application PCT/EP2008/062835, filed Sep. 25, 2008, which claims benefit of German Application No. 10 2007 047 148.5, filed Oct. 2, 2007 and U.S. Ser. No. 60/976,935, filed Oct. 2, 2007. International application PCT/EP2008/062835 is hereby incorporated by reference in its entirety.

FIELD

The disclosure relates to a projection objective for microlithography, including at least one optical assembly with optical elements which are disposed between an object plane and an image plane. The optical assembly includes at least one optical terminal element, which is disposed close to the image plane. A first immersion liquid is disposed on the image oriented surface of the optical terminal element. A second immersion liquid is disposed on the object oriented surface of the optical terminal element. The object oriented surface includes a first surface section for the imaging light to enter into the terminal element, and the image oriented surface includes a second surface portion for the imaging light to exit from the terminal element.

BACKGROUND

Projection devices for microlithography are used for producing microstructures on substrates, for example during the production of semiconductor elements. Thus, the structure of a reticle disposed in the object plane of a projection objective or of a mask disposed in the objective plane of the projection objective is imaged into an image plane, in which the substrate to be exposed (e.g. a wafer) is located.

The optical system of the projection objective typically includes several optical assemblies, each including a plurality of optical elements, like e.g. lenses or mirrors. An example of catadioptrical projection optics is described in the document U.S. 2003/0021040 A1. The disclosure of the document is incorporated herein by reference.

In immersion objectives for microlithography with apertures NA>1.0, the last image oriented optical element in front of the wafer is typically a planar convex lens, whose convex surface is configured almost semispherical. The convex surface of the planar convex lens is disposed object oriented (reticle oriented), the planar surface of the planar convex lens is disposed image oriented (wafer oriented). In other words, the planar plane of the planar convex lens forms the last transition surface of the optical system towards the image plane, and thus towards the substrate.

In order to avoid reflections, in particular total reflections, at the planar plane, an immersion liquid is provided between the last image oriented optical element and the substrate.

An embodiment of a typical configuration of an immersion objective is illustrated in FIG. 1, which depicts a terminal assembly 1 of an immersion objective, in which the immersion liquid 3 is disposed image oriented and adjacent to the planar plane 2a of a planar convex lens 2. The assembly includes an aperture 4.

The position of the optical element 2 in the optical system is such that the planar surface 2a is disposed proximal to the field, while the convex surface 2b is considered as proximal to the pupil. In this system, no optical element is provided most proximal to the wafer, for which both surfaces are not proximal to the pupil.

The FIGS. 2 and 3 emphasize that only the planar surface of the planar convex lens most proximal to the wafer can be considered as proximal to the field, while the convex surface of the lens 2 most proximal to the wafer has to be considered as proximal to the pupil. FIG. 2 shows the footprint of beam bundles 5 of various field points on the convex surface 2b of the lens 2. The beam bundles overlap strongly as it is to be expected for a surface proximal to the pupil. The intersection point 6 with the optical axis is disposed relatively central in the inner portion of the beam bundles 5.

FIG. 3 shows the footprint 5' of the same beam bundles on the planar surface 2a of the lens 2, when the beam bundles exit from the lens 2. It is evident from FIG. 3, that the intersection point with the optical axis 6' is disposed highly eccentric relative to the group of the beam bundles 5'. The fact that field points exist, whose beam bundles 5' do not overlap, shows that the planar surface 2a of the optical element 2 is disposed proximal to the field.

A planar convex lens, which terminates the optical system, can be affected by the immersion liquid over time. In particular, contaminants, which are, for example, caused by the substrate surface, the photo lacquer or similar, are deposited on the lens, which degrades the imaging quality and the service life of the optical element.

In order to utilize the service life of the projection objective, replacing the terminal optical element is an option. However, it can be difficult and rather expensive to replace a planar convex lens, in particular when it is made of expensive materials. It has been proposed to introduce a planar plate as a terminal optical element close to the wafer, which can be exchanged easily, so that it can be replaced when the quality of the imaging deteriorates.

Immersion lithography objectives can undergo deterioration of the imaging quality through scatter radiation. Respective apertures have been used, for example between optical assemblies, to substantially prevent the impact of scatter radiation on the substrate.

Examples of known immersion lithography objectives and technologies can be found in WO 2006/128613 A1, JP 2004/246343 A1, US 2004/0001190 A1, JP 2005/086148 A, as well as in EP 1768171 A1.

SUMMARY

The disclosure can provide an optical system for microlithography, which facilitates a lasting improvement of the imaging quality.

The disclosure provides a projection objective for microlithography that includes at least one optical assembly with optical elements, which are disposed between an object plane and an image plane. The optical assembly includes at least one optical terminal element, which is disposed proximal to the image plane. A first immersion liquid is disposed on the image oriented surface of the optical terminal element. A second immersion liquid is disposed on the object oriented surface of the optical terminal element. The immersion liquids can include identical or different compositions. The object oriented surface includes a first surface portion for entry of the imaging light into the terminal element. The image oriented surface includes a second surface portion for the exit of the imaging light from the terminal element. According to the disclosure, the optical terminal element includes a mechanism to prevent the passage of interfering beams and/or scatter beams.

The projection objective is an objective for immersion microlithography. The projection objective includes an optical system, in particular a catadioptric system, with an aperture of at least 1.0.

Between the image oriented surface of the optical terminal element and the substrate, an immersion liquid is introduced, in order to prevent reflections, in particular total reflections of the imaging light, when exiting from the optical system. In the present disclosure, an immersion liquid is also introduced between the optical element before the terminal element, in particular a planar convex lens, and the terminal element. This way, a transition of the imaging radiation without problems is also facilitated between the planar convex lens and the optical element of the optical system (terminal element) disposed most proximal to the image plane.

In the optical system, for example between the assemblies, further scatter light apertures can be inserted, for example in the portion between the planar convex lens and the terminal element. They can be inserted as mechanical components or they can be configured as absorbing/reflecting layers, disposed on the optical components.

The first and the second immersion liquid can have the same or different compositions.

In some embodiments, a projection objective for microlithography includes at least one optical assembly with optical elements which are disposed between an object plane and an image plane. The optical assembly includes at least one optical terminal element, which is disposed proximal to the image plane. A first immersion liquid is disposed on the image oriented surface of the optical terminal element, and a second immersion liquid is disposed on the object oriented surface of the optical terminal element. The object oriented surface includes a first surface portion for the imaging light to enter into the terminal element. The image oriented surface includes a second surface portion for the imaging light to exit from the terminal element. The optical terminal element includes a birefringent material. The birefringent material can be linear birefringent (e.g. crystalline quartz crystal, sapphire), circular birefringent (e.g. crystalline quartz crystal) or intrinsically birefringent (e.g. calcium fluoride $CaF_2$, lutetium aluminum granate LuAG).

The birefringent material is configured in particular so that birefringent effects of the optical assembly are minimized. Typically, the planar convex lens, which is located in front of the terminal element, as well as the terminal element are made of a birefringent crystalline material. The crystal axes of the elements are relatively configured, so that effects of the birerefraction are reduced, in particular minimized.

In certain embodiments, a projection objective for microlithography includes at least one optical assembly with optical elements, which are disposed between an object plane and an image plane. The optical assembly includes at least one optical terminal element, which is disposed close to the image plane. A first immersion liquid is disposed on the image oriented surface of the optical terminal element. A second immersion liquid is disposed on the object oriented surface of the optical terminal element. The object oriented surface includes a first surface portion for the imaging light to enter into the terminal element. The image oriented surface includes a second surface portion for the exit of the imaging light from the terminal element. The optical terminal element includes a birefringent material. The projection objective includes a mechanism to detect and/or control the temperature and/or the pressure of the first immersion liquid, and/or of the second immersion liquid. In particular, the projection objective includes at least one measuring device for measuring the pressure and/or the temperature within the first immersion liquid and/or within the second immersion liquid.

The projection objective can include a mechanism for changing the temperature and/or the pressure of the first immersion liquid and/or the second immersion liquid. Thus, a heater or a cooling element for the first and/or the second immersion liquid can be provided, which is for example disposed in a reservoir, by which the respective temperature of the immersion liquids can be controlled. The same applies for the pressure of the immersion liquids, which can also be controlled or regulated. This way, it is possible to adjust and change the refractive index through selecting the composition of the immersion liquids, and/or through controlling the temperature and/or the pressure of the immersion liquid. By controlling the refractive index in the immersion liquids, variations or changes of the optical system can be compensated. The system can furthermore be adapted to changing requirements.

In particular, the first surface portion of the terminal element is configured for the entry of the imaging light, and also the second surface portion of the terminal element for the exit of the imaging light are not disposed proximal to the pupil in the beam path. A surface in an optical system is considered to be "proximal to the pupil" under when all the beam bundles of different field points of the object imaged on the surface overlap, i.e. it is not possible to find two beam bundles corresponding to different field points of the object that do not overlap. Imaging all beam bundles onto a surface is designated as "footprint" on the respective surface in the context of the present disclosure.

The terminal element can include at least one planar plate. The planar plate is in particular a planar parallel plate, whose entry and exit surfaces in operating state of the projection objective are disposed in immersion liquid, or are covered by immersion liquid. Through the immersion liquid, the gap between the reticle oriented adjacent planar convex lens (more precisely its planar plane) and the first surface portion and also the gap between the second surface portion and the substrate to be exposed, are bridged. As a planar plate, not only absolutely planar parallel or planar elements (radius infinite) are to be subsumed. A planar plate in the sense of the present disclosure can also include large radii, e.g. $|R|>1000$ mm or small curvatures $|r|=1/|R|<0.001$ $mm^{-1}$. Furthermore, as the planar plate, also an element with a surface which includes a spherical or aspherical structure shall be included, if at least the first surface portion and the second surface portion overall include a small local curvature.

Providing a planar plate, which stands in immersion liquid on both sides, has the particular advantage, that materials savings can be realized, when exchanging the element arranged most proximal to the wafer (terminal element).

During the service life of a projection objective, it can be desirable to remove the terminal element, in order to clean it or in order to replace it with a substantially identical new element. Reasons for exchanging can be deposits, in particular on the wafer oriented side of the element (caused by the immersion liquid or the resist) or a change of the optical material, and thus of the imaging properties (e.g. compaction).

Furthermore, the desire can occur during the service life of the projection objective to change the composition, and thus the refraction index of the first and/or the second immersion liquid. The deterioration of the imaging quality, which would result therefrom, can be compensated by the replacement of the terminal element. Thus, it can be involved to adapt the thickness of the terminal element to the changed refraction index.

A planar plate as a terminal element can be produced with considerably less material than, for example a planar convex lens, typically used as a terminal element. The advantage is always relevant, when optical elements, for example the planar convex lens and/or the planar plate are made of expensive materials, like LuAG, spinell, barium-lithium-fluoride mixed crystals or other highly refractive materials. The use of a planar plate according to the disclosure thus causes considerable cost savings.

Furthermore, several degrees of freedom are gained by providing a planar plate as a terminal element, which is separate from the planar convex lens, wherein the degrees of freedom can be used in different ways for influencing or improving the optical properties of the projection objective.

When the planar convex lens and the planar plate are made of birefringent crystalline material, the relative alignment of the crystal axes of the two elements can be selected so that the effects of the double refraction are minimized (clocking).

Another possibility to influence the imaging properties of the system is to subsequently make the planar plate on one or both sides aspherical in order to minimize imaging errors, which are detected after assembly. For this purpose, it is useful for the planar plate to be framed, so that it can be installed and uninstalled without great complexity. Additional ways for adjustment can be provided by an adjustable frame of the planar plate through linear movement and/or pivoting.

Another advantage of using a planar plate, which is immersed on both sides, is the ability to control temperature and/or pressure of the immersion liquids on both sides of the planar plate separately, so that the imaging quality is optimized. In particular, also variations of the refractive index of the material of the planar convex lens and/or of the refractive index of the material and/or of the refractive indices of the first and second immersion liquids can be compensated. The reasons for these refractive index changes can be variations between objectives and/or temperature effects.

The terminal element can be the optical element of the optical assembly, in particular of the entire projection objective, which is most proximal to the image plane.

In an exemplary embodiment, the optical terminal element includes at least one carrier for mounting the planar plate on a carrier. The carrier can e.g. be a holder/setting, which sets the planar plate from the outside, or a carrier on whose upper side the planar plate is mounted, or similar.

In particular, the first surface portion for entry of the imaging light and/or the second surface portion for exit of the imaging light are determined by a footprint of the bundle of beams of the imaging radiation.

In an exemplary embodiment, the planar plate substantially includes the size and/or the geometry of the first surface portion for the entry of the imaging light.

In an exemplary embodiment, the planar plate includes a rectangular object oriented and/or image oriented surface. The ratio of the length a to the width b (a>b), in particular includes values between 2 and 10.

In another exemplary embodiment, the optical terminal element at least includes a shielding, which is impermeable for the interference or scatter radiation, for example at least one aperture for preventing the pass-through of scatter light through the optical terminal element can be provided in the terminal element. This aperture can be formed by the carrier itself. An aperture or blockage can, however, also be provided by a coating/blackening of the carrier, and in particular of the planar plate.

In an embodiment of the disclosure, the carrier is configured as a holder for shielding interference and/or scatter radiation, which includes at least one opening, which substantially corresponds to the size and/or the geometry of the second surface portion. The carrier can be configured light impermeable and can cover at least 10% of the wafer oriented planar surface of the planar plate.

The carrier can be a holder in particular, which sets or frames the outer walls of the planar plate.

In an exemplary embodiment of the disclosure, the image oriented surface of the planar plate includes a coating, which is impermeable for the interference and/or scatter radiation, which substantially shields the portion of the image oriented surface, outside of the second surface portion, from a pass-through of interference- or scatter radiation. The planar plate can include a coating, which is impermeable for the interference and/or scatter radiation, which is disposed along the side surfaces of the planar plate, extending in the pass-through direction of the beam.

It can be particularly advantageous for the first surface portion and/or the second surface portion to be disposed eccentric relative to the optical axis of the projection lens. The planar plate then does not have to be configured and produced as a component, which is rotation symmetrical to the optical axis. It can be produced as a rectangular plate and can be installed in the optical terminal element at a suitable position. The carrier, which is included in particular of a light impermeable material, can be used as a scatter light shade.

Thus, the planar plate can be eccentric relative to the optical axis of the projection objective.

The disclosure provides a projection objective for microlithography that includes at least one optical assembly with optical elements, which are disposed between an object plane and an image plane. The optical assembly includes at least one optical element, which is disposed proximal to the image plane. A first immersion liquid is disposed on the image oriented surface of the optical terminal element. A second immersion liquid is disposed, on the object oriented surface of the optical terminal element. The object oriented surface includes a first surface portion for entry of the imaging light into the terminal element, and the image oriented surface includes a second surface portion for the exit of the imaging light from the terminal element. The first and the second immersion liquid include different compositions.

This way, immersion liquids with advantageous properties can be used for the respective purpose. For example, low absorption can constitute an important property of the immersion layer, disposed between the planar convex lens and the planar plate (highly refrigent liquids often include a higher absorption than water). For the immersion layer disposed between the planar plate and the substrate, however, a low viscosity can be advantageous.

In order to avoid a heating of the last lens element with the associated problems, it is advantageous to keep the immersion layer on the side of the objective as thin as possible. Thus, the second immersion liquid can be disposed as a layer having a thickness of 2 mm at the most (e.g., at most 1 mm, at most 0.5 mm).

The terminal element is in particular disposed at the projection objective replaceable and/or removable.

Patent protection shall be claimed for each of the features listed above individually and in all conceivable combinations.

BRIEF DESCRIPTION OF THE FIGURES

Further features and advantages of the present disclosure become apparent with reference to the description of particular embodiments in conjunction with the appended figures, in which:

FIG. 12 shows a projection objective which includes a mechanism.

DETAILED DESCRIPTION

Figure 1:
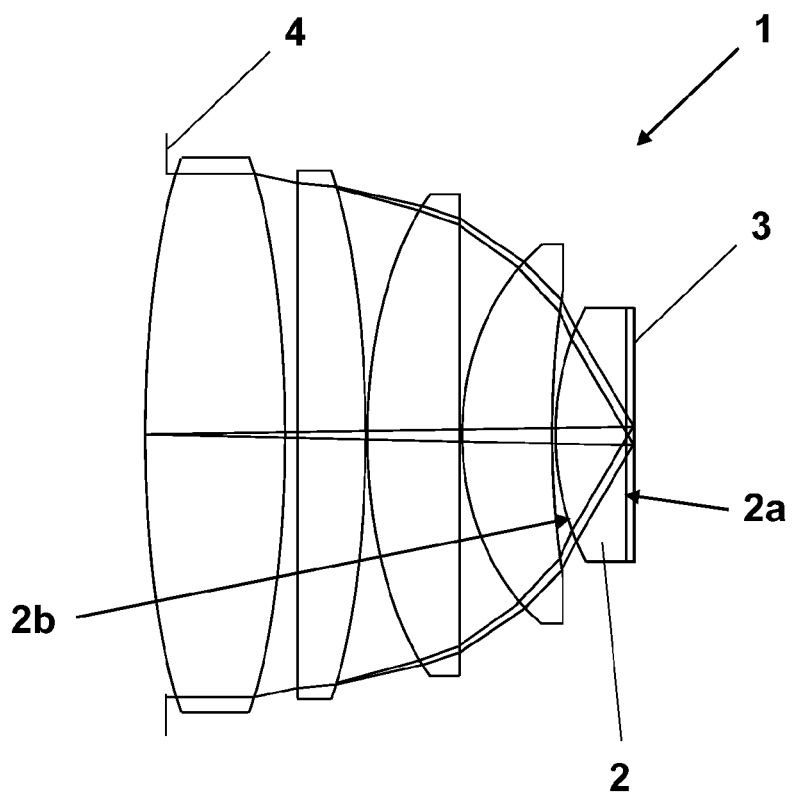
FIG. 1 shows a detail of a state of the art immersion objective.

FIG. 1 shows a detail of a known immersion objective. The illustrated optical assembly 1 includes a number of lenses, an aperture 4 and an optical connection element, which is configured as a planar convex lens 2. The planar side 2a of the lens 2 points in the direction of the image plane, thus it is oriented towards the substrate. The convex side 2b of the lens 2 thus points in the direction of the object plane, thus is oriented toward the reticle.

In the portion of the planar side 2a of the lens 2, an immersion liquid 3 is directly provided, which fills the intermediary space between the surface 2a and the substrate (not shown) to be exposed, in order to prevent a total reflection of the exposure radiation at the boundary surface.

However, the immersion liquid 3 attacks the planar surface 2a of the lens 2 or soils it through contaminants included in the immersion liquid, so that the imaging quality deteriorates over time.

Figure 2:
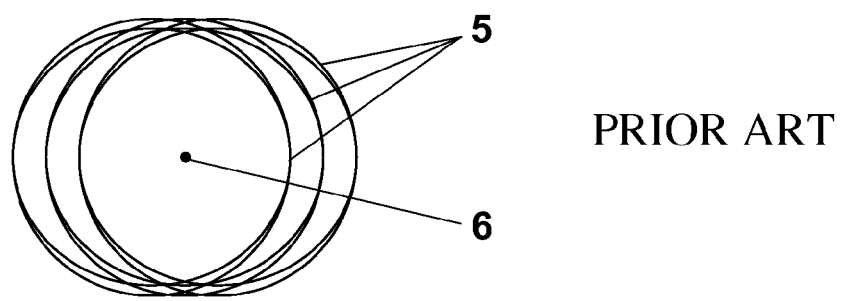
FIG. 2 shows a footprint on the convex surface of a conventional lens most proximal to the wafer.

In FIG. 2, a footprint is illustrated on the convex surface 2b of the lens 2 of the optical assembly 1. It becomes apparent that the bundles of beams 5 configured to generate the image and entering into the optical element 2 overlap strongly. On the other hand, each bundle of beams 5 includes an intersection point with the optical axis 6 of the immersion object. Thus, the convex surface 2b is to be qualified as the surface of the lens 2 proximal to the pupil.

Figure 3:
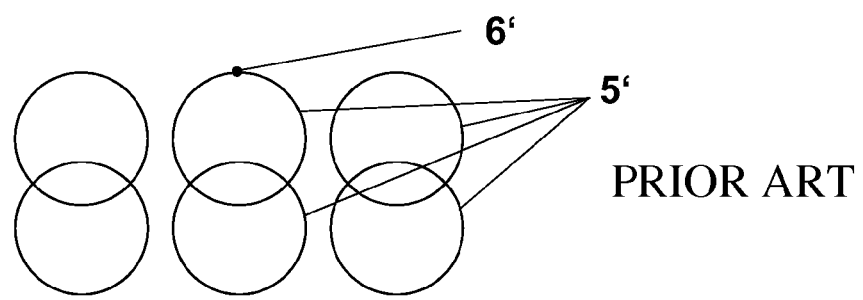
FIG. 3 shows a footprint on the planar surface of a conventional lens most proximal to the wafer.

The footprint of the planar surface 2a of the lens 2 most proximal to the wafer illustrated in FIG. 3, however, includes also at least two non-overlapping beam bundles 5'. Thus, the planar surface of the lens 2 is disposed proximal to the field. Furthermore, FIG. 3 shows that the exit portion of the lens 2, which is defined by all bundles of beams 5' passing through and configured for the image, is disposed highly eccentric relative to the optical axis 8 of the immersion objective.

Figure 4:
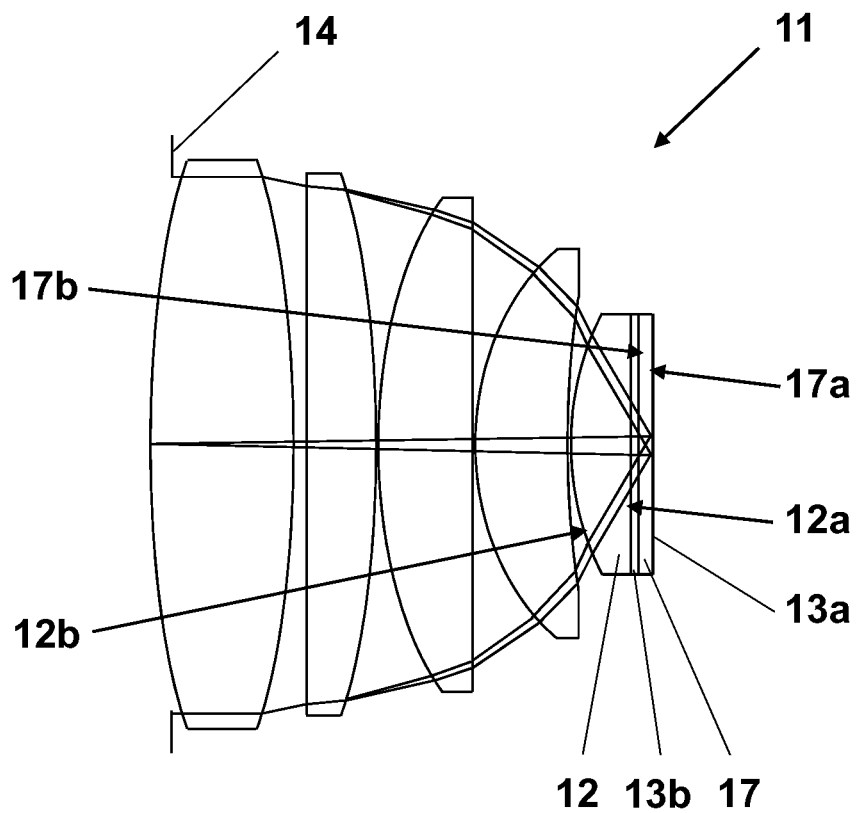
FIG. 4 shows a detail of an immersion objective according to the present disclosure.

FIG. 4 shows a detail of an embodiment of a projection objective according to the disclosure. The assembly 11 includes a number of optical elements and an aperture 14. The optical element of the assembly 11 disposed as the element before the last element oriented towards the image is a planar convex lens 12, whose convex surface 12b is disposed object oriented, and whose planar surface 12a is disposed image oriented.

As a last image oriented optical element of the assembly 11, an optical terminal element 17 is provided, which includes a planar plate. Between the planar surface 12a of the lens 12 and the planar plate of the optical terminal element 17, thus at the object oriented surface of the planar plate, and also on the image oriented side of the planar plate of the terminal element 17, respective immersion liquid 13b or 13a is provided. The planar plate is thus on both sides in contact with the immersion liquid 13a and 13b, respectively.

It is assured by configuration that contaminations of the immersion liquid 13a on the image side do not affect the planar convex lens 12 adversely. A replacement of the terminal element 17 or of the planar plate 19 of the terminal element 17 is easily possible, as soon as their imaging properties through contamination or other adverse effects become insufficient.

Figure 5:
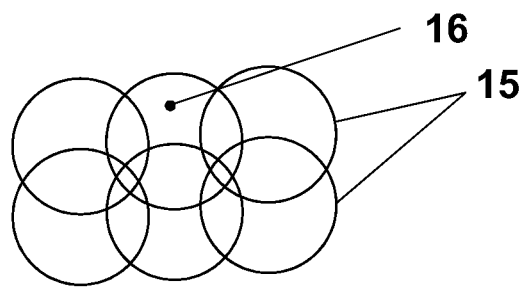
FIG. 5 shows a footprint of a first planar surface of an optical element most proximal to the wafer in a system according to the disclosure.

FIG. 5 illustrates the footprint 15 of the bundle of beams running through the system on the reticle oriented planar surface of the terminal element 17. It becomes apparent that the plate includes field points on the reticle oriented side, whose bundles of beams 15 do not overlap. This means, that also the reticle oriented planar surface of the plate 15 is not disposed proximal to the pupil in the beam path.

Figure 6:
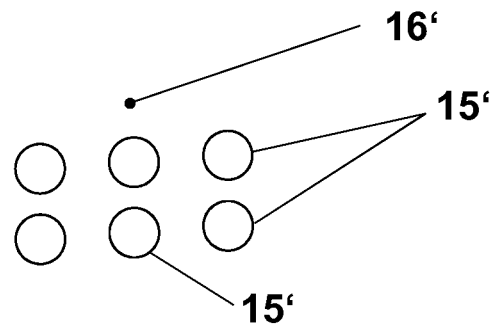
FIG. 6 shows a footprint on a second planar surface of an optical element most proximal to the wafer in a system according to the disclosure.

FIG. 6 shows a footprint on the wafer oriented planar surface 17a of the planar plate of the terminal element 17. The beam bundles 15' do not overlap. Thus, also the image oriented planar surface 17a of the plate is still disposed proximal to the field in the optical system. The beam bundles 15' are furthermore highly eccentric relative to the intersection point of the terminal element 17 with the optical axis 16' of the projection objective according to the disclosure.

Figure 7:
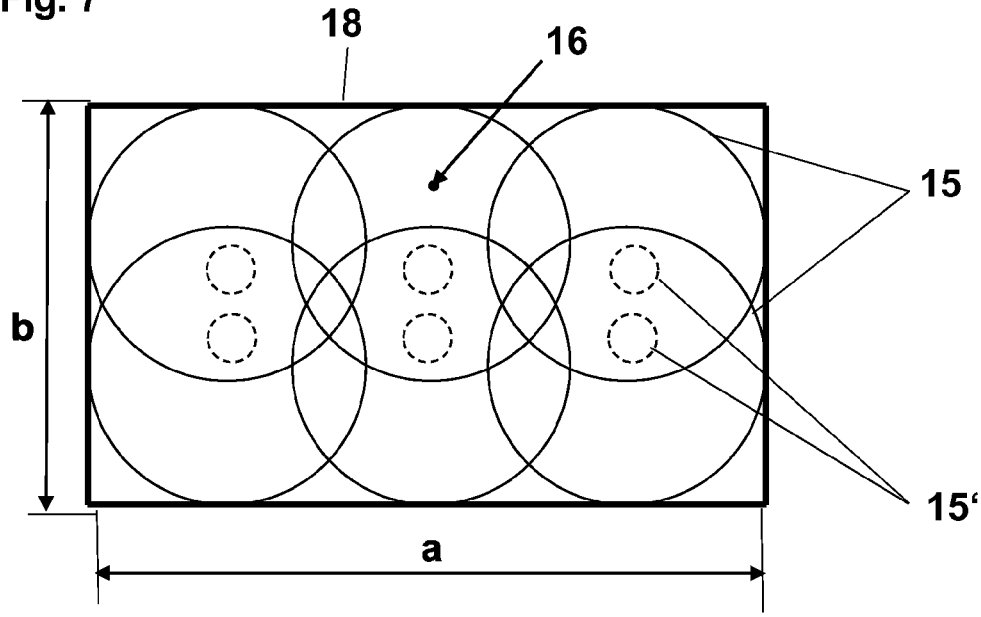
FIG. 7 shows a superposition of the footprints from FIGS. 5 and 6.

In FIG. 7, a superposition of the footprints from the FIGS. 5 and 6 is illustrated. Based on the position of the intersection point 16 with the optical axis of the system, it becomes apparent that the planar parallel terminal element is permeated by the imaging light in a highly eccentric manner relative to the optical axis of the system.

The detail 18 with the lengths of the sides a and b (a>b) is defined by the boundary of the incoming beam bundles. The exiting beam bundles 15' are also disposed within the limitation 18. According to the disclosure, the terminal element 17 is provided with a planar plate, which substantially includes a surface and geometry with the size of the section 18, thus a surface with the side lengths a and b. The ratio V=a/b is in the range between 2 and 10, this means the planar plate is configured with a rectangular surface. The planar plate is disposed and set in the optical system, so that it is permeable for imaging radiation only in the portion 18, through which the imaging light shall pass, and/or so that the planar plate extends over the portion 18.

Therefore, it is not necessary to configure and set the planar plate 19 rotationally symmetric and centered relative to the optical axis. Only the portion of the planar plate enclosed by the boundary 18 has to be produced as an optical component. This leads to material savings and facilitates a simpler fabrication of the terminal element 17.

Figure 8:
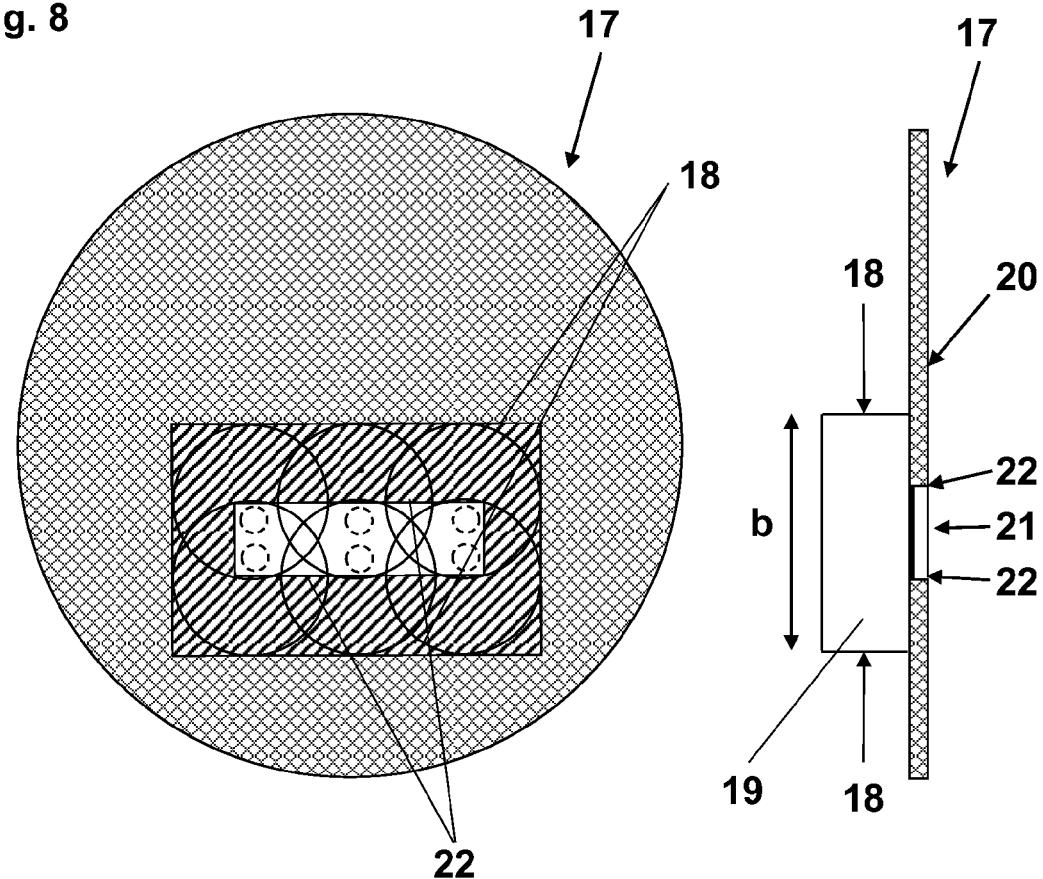
FIG. 8 shows a first embodiment of a terminal element according to the disclosure in a top view and in a lateral sectional view.

In FIG. 8, a first embodiment of a terminal element 17 according to the disclosure is shown in top view and in a lateral sectional view. The terminal element 17 substantially includes a planar plate 19 and a carrier 20. In the operating state of the projection objective, this means installed in the optical system, the planar plate 19 is wetted by immersion liquid on both sides.

The circular, black filled portion of the optical element 17 approximately corresponds to the free diameter of the planar surface of the planar convex lens 12, disposed in front of the optical element 17.

The planar plate 19 includes a length a and a width b. The surface where the image light impacts corresponds to the portion 18 defined by the footprint of the entering imaging radiation.

The carrier 20 is light impermeable. It includes a rectangular opening 21, which is defined by a rim 22. The rim 22 is defined by the footprint of the beam bundles 15', exiting from the planar plate 19 on the image oriented side. The rectangle 22 disposed within the portion 18 thus constitutes the portion of the wafer oriented planar surface of the planar plate 19, through which the imaging light leaves the planar plate 19 and reaches the wafer. Also, the intermediary portion between the exit portion 22 and the entry portion 18 is covered by the carrier 20 and thus light impermeable. The configuration and arrangement of the terminal element 17 prevents that interference light or scatter light, which exists next to the exit portion 22 of the planar plate, impacts the substrate to be exposed.

Figure 9:
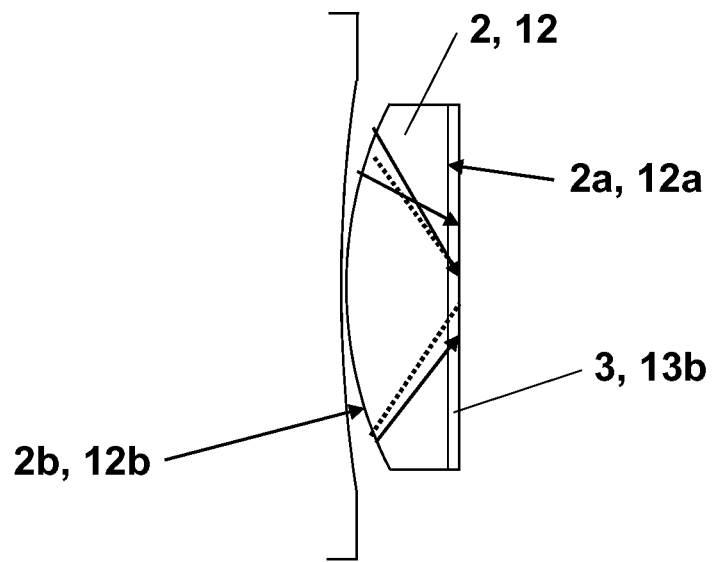
FIG. 9 shows a planar convex lens for explaining the generation of scatter light.

FIG. 9 shows a planar convex lens 2, 12 from FIG. 1 or FIG. 4 with an immersion liquid 3, 13b provided in the portion of the planar surface 2a, 12a of the lens 2, 12. The dotted lines define the portion of the lens, which is permeated by the imaging light. Scatter light or false light, which can be generated through interfering reflexes at optical boundary surfaces or through scatter in the optical material, is schematically illustrated through arrows within in the lens 2, 12. Scatter light or false light can either lead to losses of contrast in the image or it can fall on portions of the wafer, which are disposed outside of the portion to be exposed, and cause undesirable effects in this location.

Figure 10:
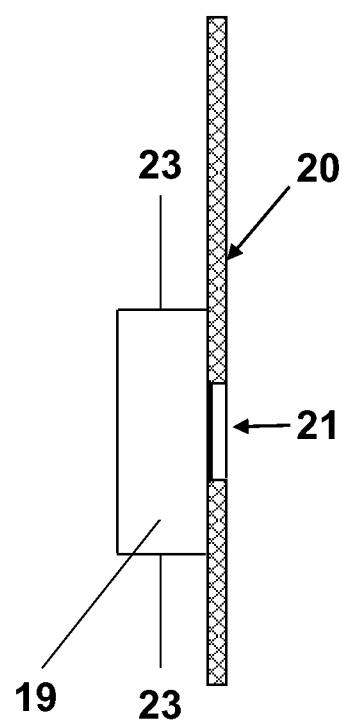
FIG. 10 shows a detail from FIG. 8.

FIG. 10 shows a detail of FIG. 8 with an illustration of the scatter light exiting from the lens 12 according to FIG. 9 symbolized by arrows. It is illustrated in FIG. 10 how interfering light is suppressed by the configuration of the optical element or by the geometric configuration and support 20 of the planar plate. Thus, scatter light or interfering light is prevented from passing through the exit opening 21 for the imaging light, on the one hand by the support 20, on the other hand by the defining side portion 23 of the planar plate, which can e.g. be provided with a light impermeable layer (at 18).

Figure 11:
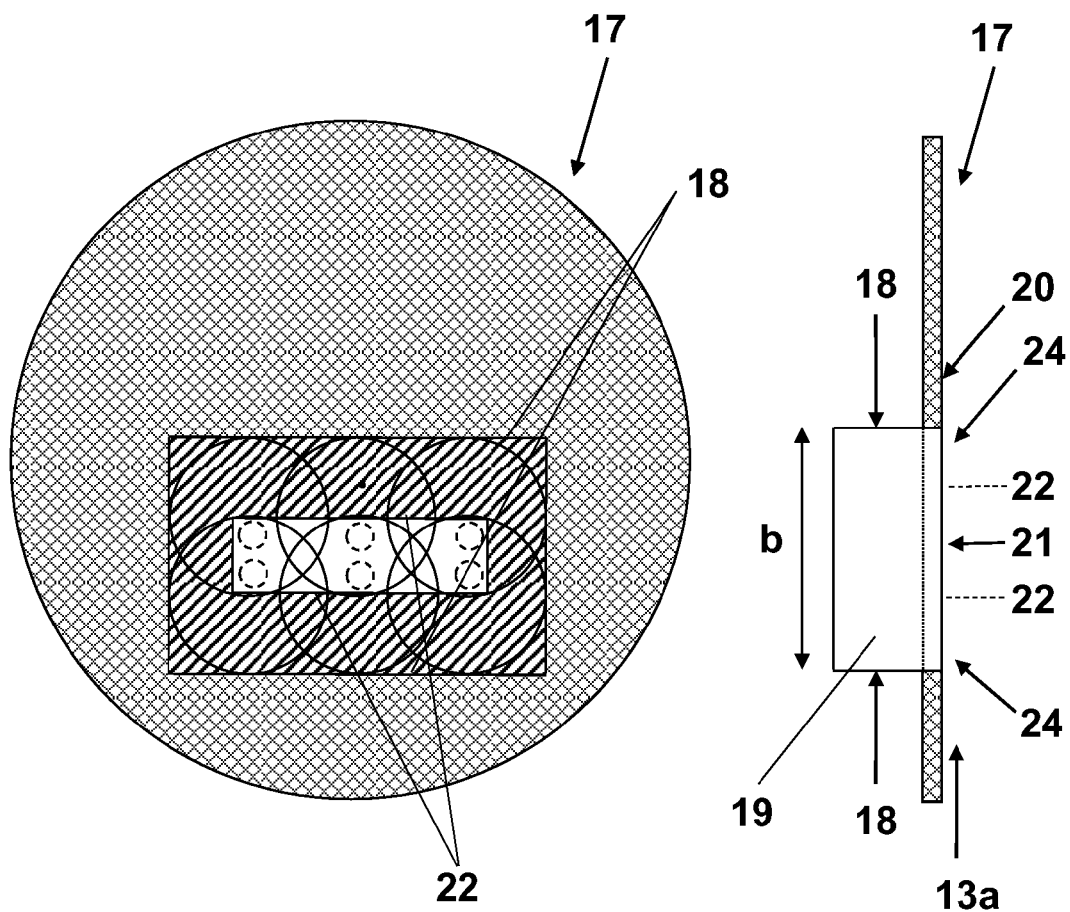
FIG. 11 shows a second embodiment of a terminal element according to the disclosure in a top view and in a lateral sectional view.

An alternative embodiment of the configuration of the optical terminal element 17 is shown in FIG. 11. The terminal element 17 includes a support 20, which sets the planar plate 19 on the side. The planar plate 19 includes an absorbing or reflecting layer outside of the exit portion 21 (defined by the exit portion boundaries 22), this means a layer 24, which is impermeable for the imaging radiation, and which prevents the passage of scatter light and interference light. Thus, light can only exit through the desired exit portion 21.

It is an advantage of the embodiment that the surface of the optical element 19 oriented towards the wafer is substantially planar in the entire image oriented portion, and thus facilitates an undisturbed flow of the immersion liquid 13a on the image oriented side.

In general, it is possible to use additional scatter light apertures in the portion between the planar convex lens and the planar plate. These can be configured as mechanical components and/or as absorbing/reflecting layers on the optical components.

FIG. 12 shows optical assembly 11 further comprising a mechanism 100. In some embodiments, mechanism 100 detects and/or controls the temperature and/or the pressure of immersion liquid 13a and/or of immersion liquid 13b. In certain embodiments, mechanism 100 changes a temperature and/or a pressure of immersion liquid 13a and/or immersion liquid 13b.

Via the disclosure, the imaging quality of a microlithography projection objective is substantially improved. When the element most proximal to the wafer is contaminated, it can be replaced in a simple manner and without great expense. Additionally, the impact of scatter radiation onto the substrate is effectively prevented by the structure and configuration of the terminal element disposed most proximal to the image plane.

What is claimed is:

1. A projection objective, comprising:
    an optical assembly comprising optical elements disposed between an object plane and an image plane, the optical assembly comprising a terminal optical element disposed proximal to the image plane;
    a first immersion liquid disposed on an image oriented surface of the terminal optical element; and
    a second immersion liquid disposed on an object oriented surface of the terminal optical element,
    wherein:
        the object oriented surface of the terminal optical element has a first surface portion for the entry of the imaging light into the terminal optical element;
        the image oriented surface of the terminal optical element has a second surface portion for the exit of the imaging light from the terminal optical element;
        the terminal optical element comprises a birefringent material;
        the projection objective comprises a mechanism configured to detect and control a temperature of the second immersion liquid; and
        the projection objective is a projection objective for microlithography.

2. The projection objective according to claim 1, wherein an optical axis of the birefringent material is configured so that birefringent effects of the optical assembly are minimized.

3. The projection objective according to claim 1, wherein the projection objective comprises a mechanism configured to detect and/or control a temperature and/or a pressure of the first immersion liquid and/or of the second immersion liquid.

4. The projection objective according to claim 1, wherein the terminal optical element comprises a planar plate.

5. The projection objective according to claim 1, wherein the terminal optical element is the optical element of the optical assembly that is most proximal to the image plane.

6. The projection objective according to claim 1, further comprising a support on which the terminal optical element is mounted.

7. The projection objective according to claim 1, wherein the first surface portion of the terminal optical element and/or the second surface portion of the terminal optical element is defined by a footprint of the beam bundles of the imaging radiation of the projection objective on the respective surface of the terminal optical element.

8. The projection objective according to claim 1, wherein the terminal optical element substantially comprises a size and/or a geometry of the first surface portion of the terminal optical element.

9. The projection objective according to claim 1, wherein the terminal optical element comprises a substantially rectangular object oriented surface and/or a rectangular image oriented surface.

10. The projection objective according to claim 1, wherein the terminal optical element comprises a shielding which is impermeable to interference radiation or scatter radiation.

11. The projection objective according to claim 1, further comprising a holder configured to shield interference radiation and/or scatter radiation, wherein the holder has at least one opening that substantially corresponds to a size and/or to a geometry of the second surface portion of the terminal optical element.

12. The projection objective according to claim 1, further comprising a holder that sets the outer rims of the terminal optical element.

13. The projection objective according to claim 1, wherein the image oriented surface of the terminal optical element comprises a coating that is impermeable to interference radiation and/or scatter radiation, and the coating shields substantially the portion of the image oriented surface of the terminal optical element that is outside of the second surface portion of the terminal optical element against an exit of interference radiation or scatter radiation.

14. The projection objective according to claim 1, wherein the terminal optical element comprises a coating that is impermeable to interference radiation and/or scatter radiation, and the coating is disposed on lateral surfaces of the terminal optical element that are substantially parallel to an optical axis of the system.

15. The projection objective according to claim 1, wherein the first surface portion of the terminal optical element and/or the second surface portion of the terminal optical element is eccentric with respect to an optical axis of the projection objective.

16. The projection objective according to claim 1, wherein the terminal optical element is eccentric relative to an optical axis of the projection objective.

17. The projection objective according to claim 1, wherein the first immersion liquid and the second immersion liquid comprise different compositions.

18. The projection objective according to claim 1, wherein the second immersion liquid is a layer with a thickness of at most 2 mm.

19. The projection objective according to claim 1, wherein the terminal optical element is replaceable and/or removable.

20. The projection objective of claim 1, wherein the terminal optical element comprises a mechanism configured to prevent the passage of interfering radiation and/or scatter radiation through the terminal optical element.

21. The projection objective according to claim 20, wherein the mechanism configured to prevent the passage of interfering radiation and/or scatter radiation through the terminal optical element comprises a shielding.

22. The projection objective according to claim 1, wherein the projection objective comprises a mechanism configured to detect and/or control a pressure of the first immersion liquid and/or of the second immersion liquid.

23. A projection objective, comprising:
an optical assembly comprising optical elements disposed between an object plane and an image plane, the optical assembly comprising a terminal optical element disposed proximal to the image plane;
a first immersion liquid disposed on an image oriented surface of the terminal optical element; and
a second immersion liquid disposed on an object oriented surface of the terminal optical element,
wherein:
the object oriented surface of the terminal optical element has a first surface portion for the entry of the imaging light into the terminal optical element;
the image oriented surface of the terminal optical element has a second surface portion for the exit of the imaging light from the terminal optical element;
the terminal optical element comprises a birefringent material;
the projection objective comprises a mechanism configured to detect and control a pressure of the second immersion liquid; and
the projection objective is a projection objective for microlithography.

* * * * *

UNITED STATES PATENT AND TRADEMARK OFFICE
CERTIFICATE OF CORRECTION

| | |
|---|---|
| PATENT NO. | : 8,436,982 B2 |
| APPLICATION NO. | : 12/723496 |
| DATED | : May 7, 2013 |
| INVENTOR(S) | : Helmut Beierl et al. |

It is certified that error appears in the above-identified patent and that said Letters Patent is hereby corrected as shown below:

In the Specification

Column 3, Line 41: delete "granate" and insert --garnet--.

Column 3, Lines 47-48: delete "birerefraction" and insert --birefringence--.

Signed and Sealed this
Third Day of September, 2013

Teresa Stanek Rea
*Acting Director of the United States Patent and Trademark Office*